US007979261B2

(12) United States Patent
Matsuura

(10) Patent No.: US 7,979,261 B2
(45) Date of Patent: Jul. 12, 2011

(54) CIRCUIT SIMULATION MODEL GENERATION APPARATUS, CIRCUIT SIMULATION MODEL GENERATION METHOD AND CIRCUIT SIMULATION APPARATUS

(75) Inventor: Satoshi Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/654,074

(22) Filed: Dec. 9, 2009

(65) Prior Publication Data

US 2010/0094610 A1   Apr. 15, 2010

Related U.S. Application Data

(63) Continuation of application No. PCT/JP2007/062390, filed on Jun. 20, 2007.

(51) Int. Cl.
G06F 17/50 (2006.01)
(52) U.S. Cl. .......................... 703/14; 716/109
(58) Field of Classification Search .................. 703/14, 703/13; 716/16, 4, 5, 109; 702/77; 257/778
See application file for complete search history.

(56) References Cited

U.S. PATENT DOCUMENTS

| 2002/0045995 | A1* | 4/2002 | Shimazaki et al. ............. 702/77 |
| 2003/0069722 | A1* | 4/2003 | Beattie et al. .................. 703/14 |
| 2006/0048081 | A1* | 3/2006 | Kiel et al. ......................... 716/4 |
| 2006/0123366 | A1* | 6/2006 | Ogawa ............................. 716/5 |
| 2006/0225009 | A1  | 10/2006 | Reddy et al. ...................... 716/4 |
| 2007/0044063 | A1* | 2/2007 | Faour ............................... 716/16 |
| 2007/0057380 | A1* | 3/2007 | Katagiri et al. ................. 257/778 |
| 2007/0185699 | A1* | 8/2007 | Suwa et al. ...................... 703/13 |
| 2007/0209027 | A1* | 9/2007 | Usui ................................. 716/4 |
| 2008/0281570 | A1* | 11/2008 | Joshi et al. ...................... 703/14 |

FOREIGN PATENT DOCUMENTS

JP   2002-56044    2/2002
JP   2006-285960   10/2006

OTHER PUBLICATIONS

Jiang et al., "HRM—A hierarchical simulator for full-chip power network reliability analysis", IEEE 2001.*
Nurmi et al., "Power management of the autonomous error-tolerant cell", IEEE, 2002.*
English Translation of the International Preliminary Report on Patentability issued Jan. 12, 2010.
International Search Report for PCT/JP2007/062390, mailed Jul. 24, 2007.

* cited by examiner

Primary Examiner — Kandasamy Thangavelu
(74) Attorney, Agent, or Firm — Fujitsu Patent Center

(57) ABSTRACT

A circuit simulation model generation apparatus includes: a power supply wiring model generation section that generates a power supply wiring model which is a model of the power supply wiring; a logic circuit model generation section that generates a logic circuit model which is a model of the logic circuit; and a link section that adds, to the logic circuit model and the power supply wiring model, a voltage controller that acquires a potential value of a logic circuit connecting terminal and gives the acquired potential value to a power supply wiring connecting terminal and a current controller that acquires a current value of the power supply wiring connecting terminal and gives the acquired current value to the logic circuit connecting terminal in the simulation, and links the logic circuit model and the power supply wiring model to generate a simulation model.

19 Claims, 9 Drawing Sheets

```
1: MP1  X  A  VDD_X  PCH
2: MN1  X  A  VSS  NCH
3: R00  VDD_Y  VDD_X  R=0
4: E00  VDD_Y  VSS  VOL='V(VDD_YY)'
5: G00  VDD_YY  VSS_YY  CUR='I(R00)'
6: RR  VDD  VDD_YY  R=RR
```

CIRCUIT SIMULATION MODEL GENERATION APPARATUS, CIRCUIT SIMULATION MODEL GENERATION METHOD AND CIRCUIT SIMULATION APPARATUS

CROSS-REFERENCE TO RELATED APPLICATIONS

This application is a continuation application, filed under 35 U.S.C. §111(a), of PCT Application No. PCT/JP2007/062390, filed on Jun. 20, 2007, the disclosure of which is herein incorporated in its entirety by reference.

FIELD

The embodiment discussed herein is related to a circuit simulation model generation apparatus, a circuit simulation model generation method, and a circuit simulation apparatus for use in evaluation of power supply noise of a circuit.

BACKGROUND

First, an integrated circuit which is a target of the power supply noise evaluation will be described. FIG. 10 is a circuit diagram illustrating an example of an integrated circuit. The integrated circuit of FIG. 10 includes power supply wiring sections 101a and 101b and a logic circuit section 102. The power supply wiring section 101a is a power supply wiring that connects an externally given potential VDD and a VDD terminal of the logic circuit section 102. The power supply wiring section 101b is a power supply wiring that connects an externally given potential VSS and a VSS terminal of the logic circuit section 102. Conventionally, as an evaluation method of a power supply system in such an integrated circuit, the following two evaluation methods have been used.

The first evaluation method creates a simulation model for the entire integrated circuit without distinguishing between the power supply wiring section and logic circuit section and performs simulation of operation of the entire integrated circuit to thereby measure a power supply waveform. FIG. 11 is a circuit diagram illustrating an example of a simulation model in the conventional first evaluation method. The simulation model of FIG. 11 includes power supply wiring section 111a and 111b and a logic circuit section 112. The power supply wiring sections 111a and 111b and the logic circuit section 112 correspond respectively to the abovementioned power supply wiring sections 101a and 101b and logic circuit section 102. The first evaluation method uses such an entire simulation model to perform a single simulation.

The second evaluation method creates a simulation model individually for the logic circuit section and power supply wiring section and separately performs simulation of operation of the logic circuit section and that of the power supply wiring section. FIG. 12 is a circuit diagram illustrating an example of a logic circuit section model in the conventional second evaluation method. FIG. 13 is a circuit diagram illustrating an example of a power supply wiring section model in the conventional second evaluation method. In FIGS. 12 and 13, the same reference numerals as those in FIG. 11 denote the same or corresponding parts as those in FIG. 11, and the descriptions thereof will be omitted here. In the second evaluation method, a logic circuit section model and a power supply wiring section model are created as simulation models. The logic circuit section model includes a logic circuit section 112. The power supply wiring section model includes power supply wiring sections 111a and 111b and a current source 124. A power is supplied to the logic circuit section 112 by an ideal source.

The second evaluation method uses the ideal source to be given to the logic circuit section 112 to perform simulation of the logic circuit section model to thereby measure a current waveform of a power supply of the logic circuit section 112 and inputs the obtained current waveform to the power supply wiring sections 111a and 111b by means of the current source 124 to perform simulation of the power supply wiring section to thereby measure a voltage change.

As a related art, there is known a voltage drop/current density analysis apparatus that replaces a charging/discharging path by a current source/switch model and replaces a power supply wiring by a resistor model to thereby generate an analysis circuit.
[Patent Document 1] Japanese Laid-open Patent Publication No. 2002-56044

The first evaluation method can sometimes be applied to a case where the circuit scale is small. However, when the circuit scale becomes larger, simulation cannot run or, if simulation runs, a considerably long time is taken for the simulation.

Further, in the second evaluation method, the voltage and current, which correlate with each other in the actual circuit, are measured independently, so that an evaluation result does not coincide with the actual operation. As a result, an effective evaluation cannot sometimes be obtained.

SUMMARY

According to an aspect of the invention, a circuit simulation model generation apparatus generates a simulation model used for simulation of a target circuit, and the apparatus including: a power supply wiring model generation section that extracts information of a power supply wiring from information of the target circuit and generates a power supply wiring model which is a model of the power supply wiring; a logic circuit model generation section that extracts information of a logic circuit from information of the target circuit and generates a logic circuit model which is a model of the logic circuit; and a link section that adds, to the logic circuit model and the power supply wiring model, a voltage controller that acquires a potential value of a logic circuit connecting terminal and gives the acquired potential value to a power supply wiring connecting terminal and a current controller that acquires a current value of the power supply wiring connecting terminal and gives the acquired current value to the logic circuit connecting terminal in the simulation, and links the logic circuit model and the power supply wiring model to generate a simulation model, the logic circuit connecting terminal being a terminal connected to the logic circuit in the power supply wiring, the power supply wiring connecting terminal being a terminal connected to the power supply wiring in the logic circuit in the simulation.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment of the present invention will be described below with reference to the accompanying drawings.

A circuit simulation apparatus will be described as an example of the embodiment in the present embodiment.

A configuration of the circuit simulation apparatus according to the present embodiment will be described.

Figure 1:
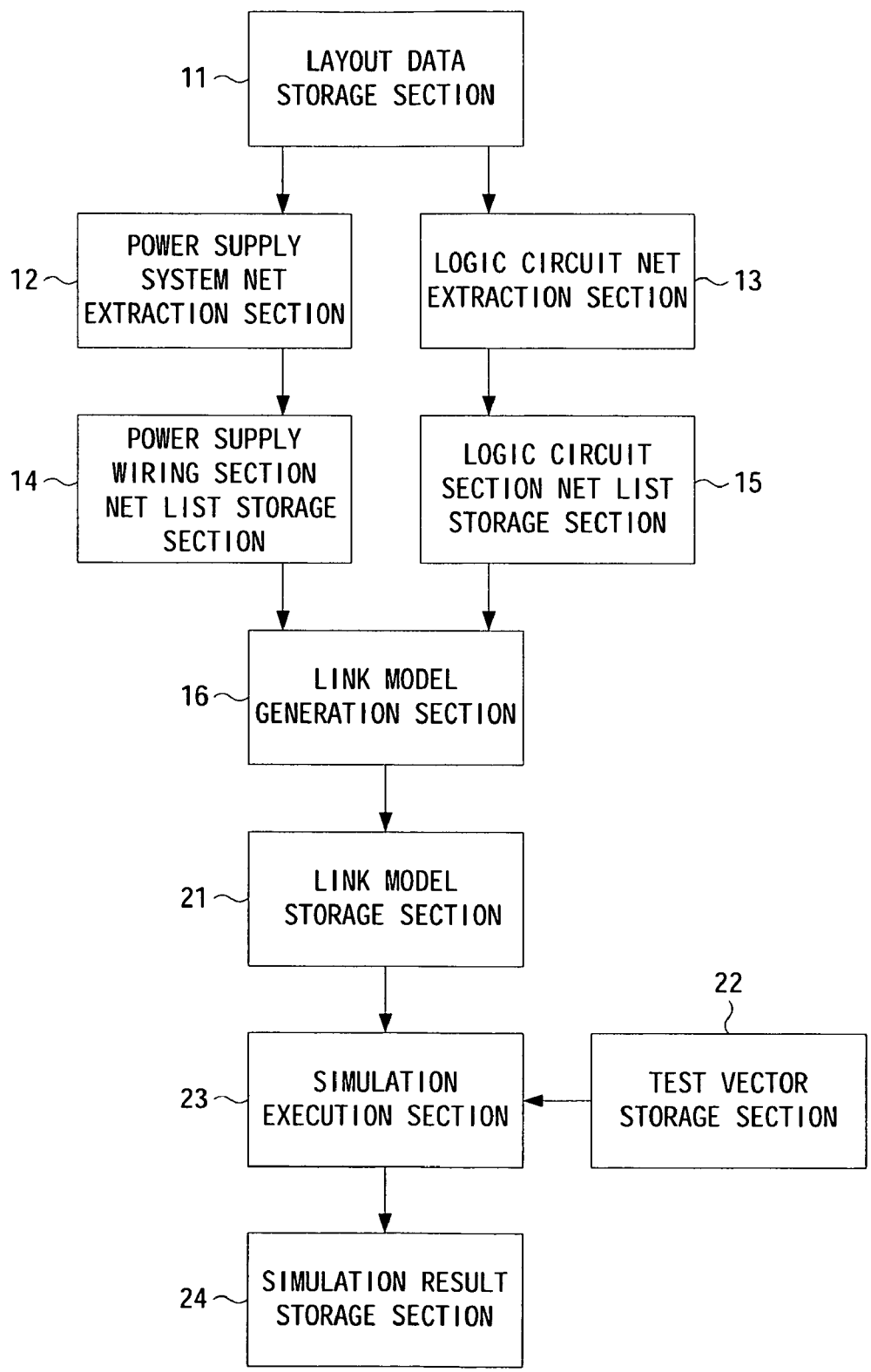
FIG. 1 is a block diagram illustrating an example of a configuration of a circuit simulation apparatus according to an embodiment of the present invention.

FIG. 1 is a block diagram illustrating an example of a configuration of the circuit simulation apparatus according to the present embodiment. The circuit simulation model generation apparatus of FIG. 1 includes a layout data storage section 11, a power supply system net extraction section 12, a logic circuit net extraction section 13, a power supply wiring section net list storage section 14, a logic circuit section net list storage section 15, a link model generation section 16, a link model storage section 21, a test vector storage section 22, a simulation execution section 23, and a simulation result storage section 24.

Next, operation of the circuit simulation apparatus according to the present embodiment will be described.

Figure 2:
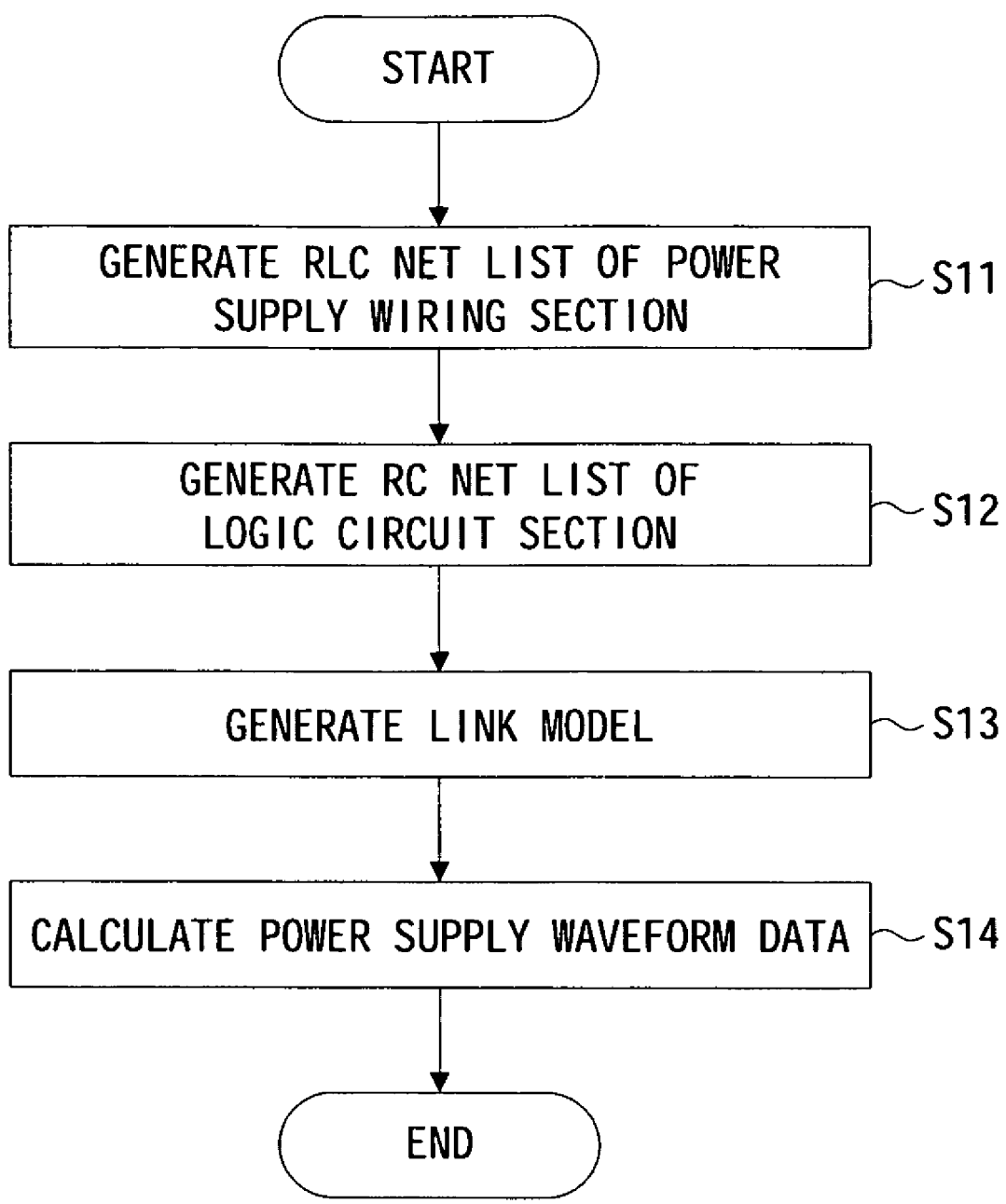
FIG. 2 is a flowchart illustrating an example of operation of the circuit simulation apparatus according to the present embodiment.

FIG. 2 is a flowchart illustrating an example of operation of the circuit simulation apparatus according to the present embodiment. Layout data of a circuit to be subjected to circuit simulation is previously stored in the layout data storage section 11. Further, test vector data used in the simulation is previously stored in the test vector storage section 22.

The power supply system net extraction section 12 extracts a power supply wiring section from the layout data stored in the layout data storage section 11, models the wiring using an RLC (the "R" means a resistance value, the "L" means an inductance value and the "C" means a capacitance value) to generate an RLC net list, and stores the RLC net list in the power supply wiring section net list storage section 14 as a power supply wiring section net list (S11). Then, the logic circuit net extraction section 13 extracts a logic circuit section from the layout data stored in the layout data storage section 11, models the wiring using an RC (the "R" means a resistance value and the "C" means a capacitance value) to generate an RC net list, and stores the RC net list in the logic circuit section net list storage section 15 as a logic circuit section net list (S12).

Then, the link model generation section 16 acquires the power supply wiring section net list stored in the power supply wiring section net list storage section 14 and logic circuit section net list stored in the logic circuit section net list storage section 15, virtually links the power supply wiring section net list and logic circuit section net list to generate a link model which is a simulation model, and stores the link model in the link model storage section 21.

Then, the simulation execution section 23 acquires the link model stored in the link model storage section 21 and test vector data stored in the test vector storage section 22, calculates power supply waveform (power supply current waveform, power supply voltage waveform) data from the link model and test vector data, and stores the calculated power supply waveform data in the simulation result storage section 24 (S14). Then, this flow is ended.

The simulation execution section 23 uses, e.g., a circuit simulator SPICE (Simulation Program with Integrated Circuit Emphasis) and, in this case, the link model is described with a SPICE command.

Next, the link model will be described.

Figure 3:
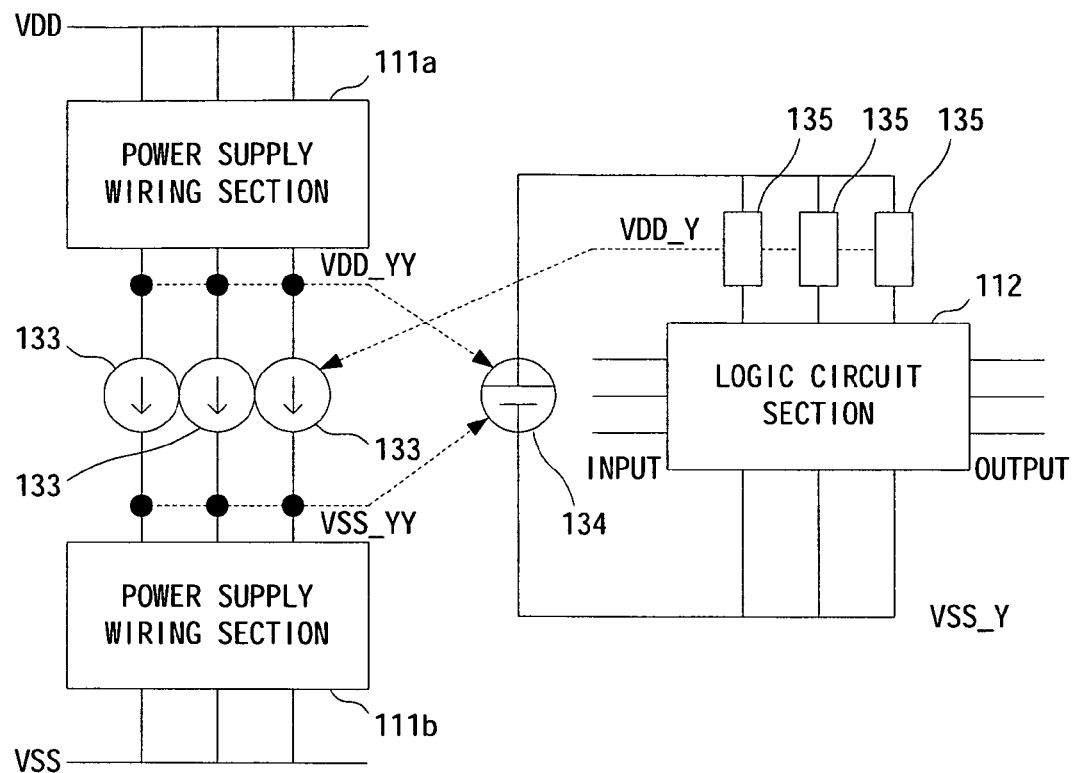
FIG. 3 is a circuit diagram illustrating a link model according to the present embodiment.
Figure 11:
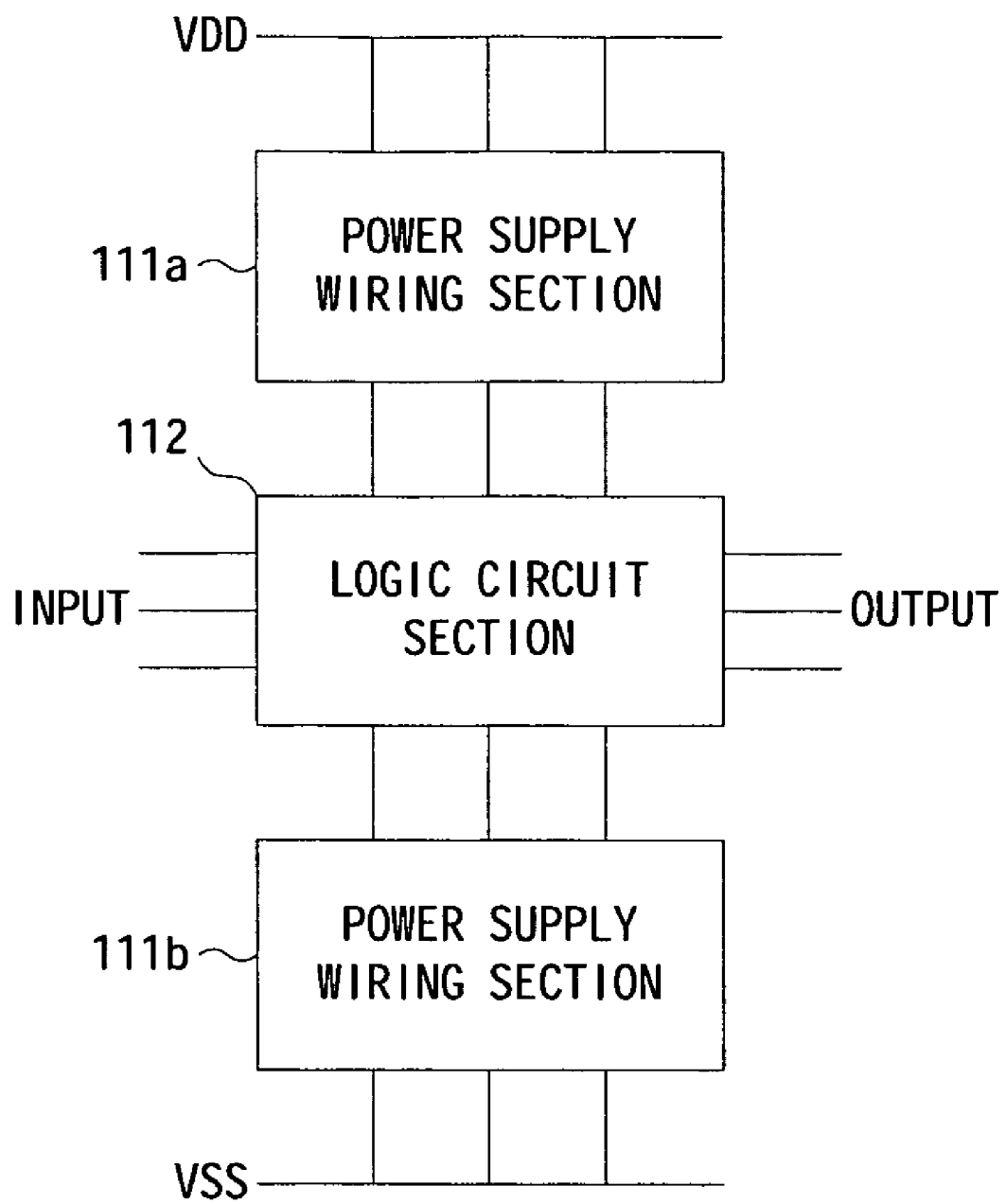
FIG. 11 is a circuit diagram illustrating an example of a simulation model in a conventional first evaluation method.
Figure 12:
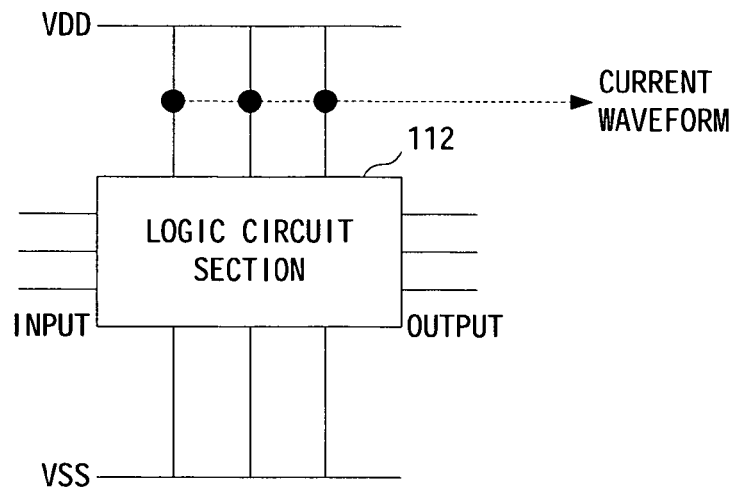
FIG. 12 is a circuit diagram illustrating an example of a logic circuit section model in a conventional second evaluation method.
Figure 13:
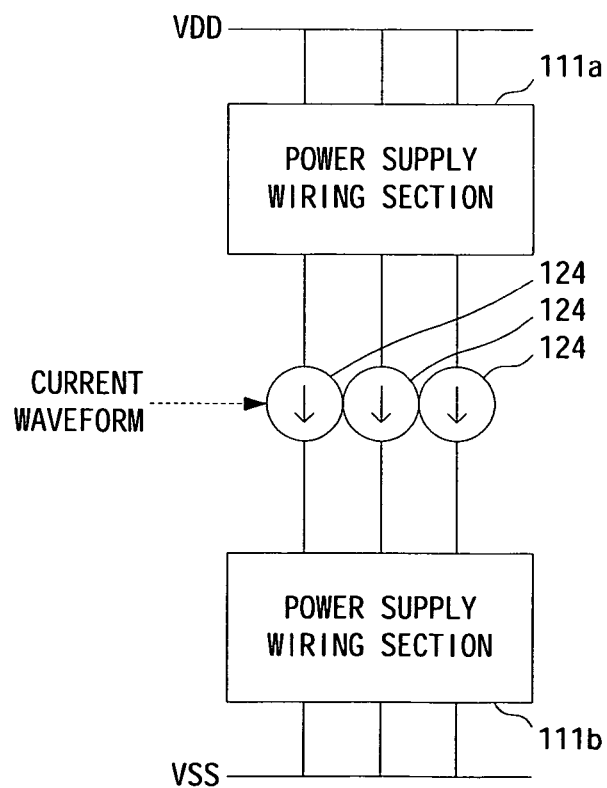
FIG. 13 is a circuit diagram illustrating an example of a power supply wiring section model in a conventional second evaluation method.

FIG. 3 is a circuit diagram illustrating a link model according to the present embodiment. In FIG. 3, the same reference numerals as those in FIG. 11 denote the same or corresponding parts as those in FIG. 11, and the descriptions thereof will be omitted here. The simulation model of FIG. 3 includes power supply wiring sections 111a and 111b, a logic circuit section 112, a current controller 133, a voltage controller 134, and a current measurement section 135.

In the power supply wiring section 111a, it is assumed that a node connected to an external VDD is VDD and that a node corresponding to the VDD side of the logic circuit section 112 is VDD_YY. Further, in the power supply wiring section 111b, it is assumed that a node connected to an external VSS is VSS and that a node corresponding to the VSS side of the logic circuit section 112 is VSS_YY. Further, in the logic circuit section 112, it is assumed that a node corresponding to the VDD_YY of the power supply wiring section 111a is VDD_Y and that a node corresponding to the VSS_YY of the power supply wiring section 111b is VSS_Y.

The voltage controller 134 acquires the potential of the VDD_YY of the power supply wiring section 111a and sets the acquired value to the potential of the VDD_Y. Similarly, the voltage controller 134 acquires the potential of the VSS_YY of the power supply wiring section 111b and sets the acquired value to the potential of the VSS_Y. The current controller 133 acquires a current flowing in the VDD_Y (current measurement section 135) of the logic circuit section 112 and sets the acquired value to a current flowing from the VDD_YY to VSS_YY. The power supply wiring section 111a and 111b and the logic circuit section 112 are virtually connected to one another by the current controller 133, the voltage controller 134, and the current measurement section 135 to establish a link model as one simulation model.

A concrete example of the link model will be described.

Figure 4:
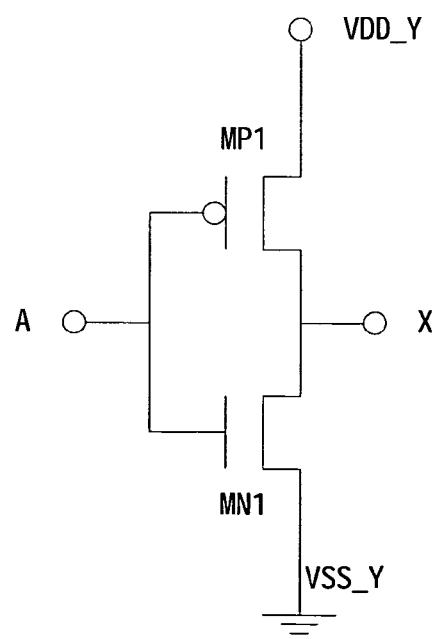
FIG. 4 is a circuit diagram illustrating an example of a logic circuit section according to the present embodiment.

First, a concrete example of the logic circuit section 112 in a target circuit will be described. FIG. 4 is a circuit diagram illustrating an example of the logic circuit section according to the present embodiment. The logic circuit section 112 has, as power supply terminals, a VDD-side node VDD_Y, a VSS-side node VSS_Y, an input node A, and an output node X. The logic circuit section 112 is assumed to be an inverter constituted by a PMOS transistor MP1 and NMOS transistor MN1. For simplification, the VSS_Y, VSS_YY, and VSS are assumed to be grounded.

Figures 5, 6:
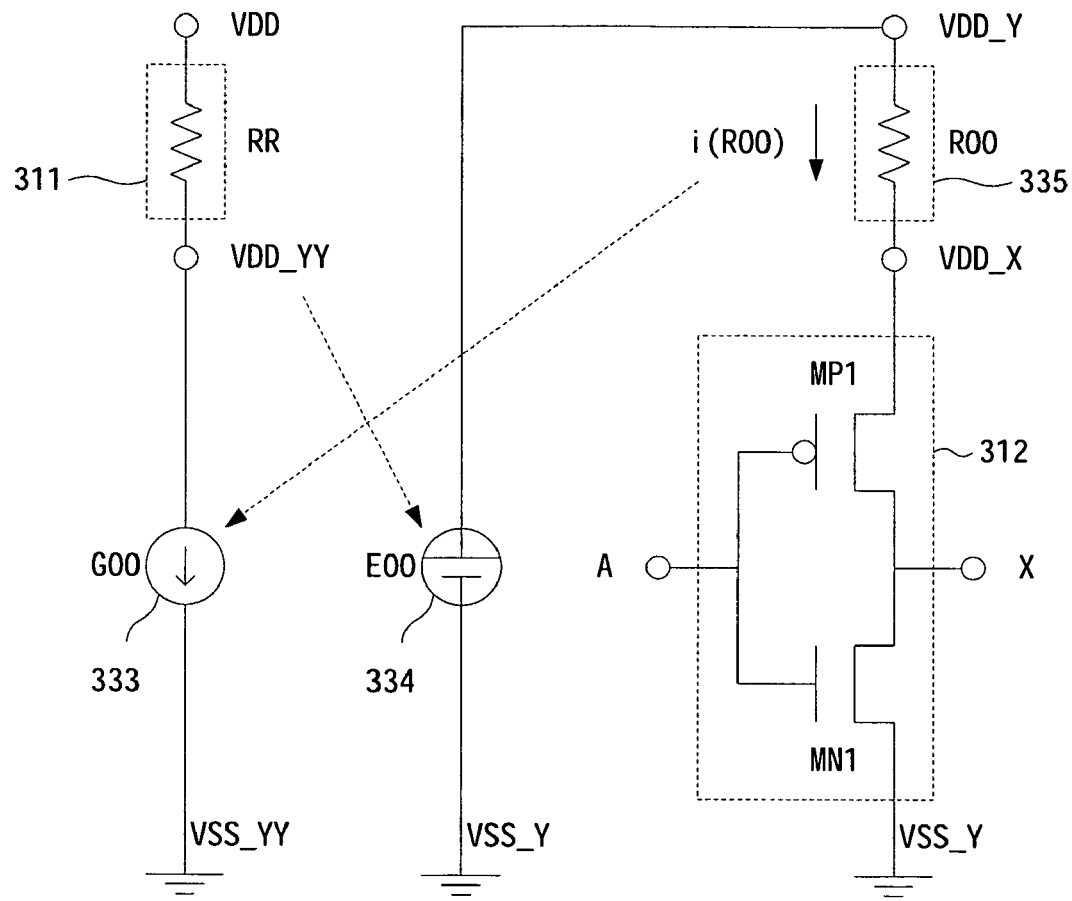
FIG. 5 is a circuit diagram illustrating an example of a link model according to the present embodiment.
FIG. 6 is a command representing an example of a link model according to the present embodiment.

A concrete example of a link model of the target circuit will next be described. FIG. 5 is a circuit diagram illustrating an example of a link model according to the present embodiment. The link model of FIG. 5 includes a power supply wiring section 311, a logic circuit section 312, a current controller 333, a voltage controller 334, and a current measurement section 335.

The power supply wiring section 311 corresponds the power supply wiring section 111a and is represented by a resistor RR. The logic circuit section 312 corresponds to the logic circuit section 112 and is represented by transistors MP1 and MN1. The current controller 333 corresponds to the current controller 133 and is represented by a current control element G00. The voltage controller 334 corresponds to the voltage controller 134 and is represented by a voltage control element E00. The current measurement section 335 corresponds to the current measurement section 135 and is represented by a resistor R00.

A concrete example in which the above link model is described with a command of a circuit simulator SPICE will next be described. FIG. 6 is a command representing an example of the link model according to the present embodiment.

The first to fourth lines represent the logic circuit section and its surrounding circuit. The first line represents the transistor MP1 and represents that the drain, gate, source thereof are connected to X, A, and VDD_X, respectively. The second line represents the transistor MN1 and represents that the drain, gate, source thereof are connected to X, A, and VSS, respectively. The third line represents the resistor R00 and represents that a resistor with a resistance of 0 is connected between the VDD_Y and VDD_X for current measurement. The fourth line represents the voltage control element E00 and represents that the voltage value between the VDD_Y and VSS (ground) is set to a potential value measured at the VDD_YY.

The fifth to sixth lines represent the power supply wiring section and its surrounding circuit. The fifth line represents the current control element G00 and represents that the value of a current flowing from the VDD_YY to VSS_YY is set to a current value i (R00) measured at the resistor R00. The sixth line represents the resistor RR and represents that a resistor with a resistance of RR is connected between the VDD and VDD_YY.

A case where a target circuit is an integrated circuit having the N same logic circuit sections will next be described. N is an integer being two or more. The case where N is 8 is explained below.

Figure 7:
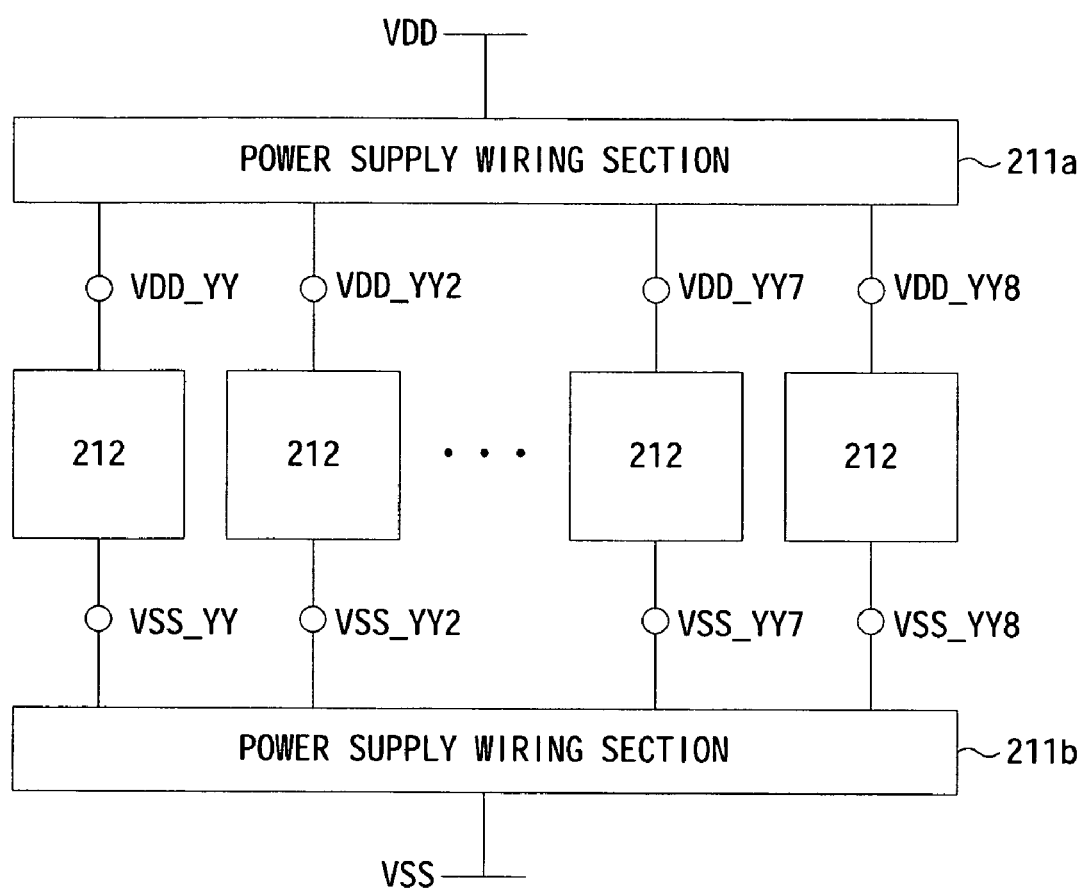
FIG. 7 is a circuit diagram illustrating an example of a target circuit according to the present embodiment.

FIG. 7 is a circuit diagram illustrating an example of a target circuit according to the present embodiment. The target circuit includes power supply wiring sections 211a and 211b and eight logic circuit sections 212 having the same configuration. The power supply wiring section 211a has a node VDD connected to an external VDD and eight nodes VDD_YY, VDD_YY2, VDD_YY3, VDD_YY4, VDD_YY5, VDD_YY6, VDD_YY7, and VDD_YY8. The VDD_YY, VDD_YY2, VDD_YY3, VDD_YY4, VDD_YY5, VDD_YY6, VDD_YY7, and VDD_YY8 are connected to VDD-side power supply terminals of the corresponding logic circuit section 212. Similarly, the power supply wiring section 211b has a node VSS connected to an external VSS and eight nodes VSS_YY, VSS_YY2, VSS_YY3, VSS_YY4, VSS_YY5, VSS_YY6, VSS_YY7, and VSS_YY8. The VSS_YY, VSS_YY2, VSS_YY3, VSS_YY4, VSS_YY5, VSS_YY6, VSS_YY7, and VSS_YY8 are connected to VSS-side power supply terminals of the corresponding logic circuit section 212.

In the evaluation of power supply noise, evaluation of the worst case where the power supply current of the logic circuit section 212 is the largest is important. In a target circuit where there are a plurality of the same logic circuit sections 212 like the abovementioned example, the worst case is realized when all the logic circuit sections 212 perform the same operation and the same signals are input to the inputs A of the logic circuit sections 212. In the case where all the logic circuit sections 212 perform the same operation, the power supply potentials of the respective logic circuit sections 212 can be approximated to the same value. At this time, the same power supply current flows in all the logic circuit sections, so that a current of eight times the current flowing in one logic circuit section 212 flows between the power supply wiring sections 211a and 211b.

The link model generation section 16 detects, for a target circuit where there are a plurality of the same logic circuit sections 212 like the abovementioned example, the power supply terminals VDD_Y and VSS_Y from the logic circuit section net list. As described above, the voltage controller 134 acquires the potential of the VDD_YY of the power supply wiring section 111a and sets the acquired value to the potential of the VDD_Y. Similarly, the voltage controller 134 acquires the potential of the VSS_YY of the power supply wiring section 111b and sets the acquired value to the potential of the VSS_Y. The current controller 133 acquires a current flowing in the VDD_Y (current measurement section 135) of the logic circuit section 112 and sets a current eight times the acquired value to a current flowing from the VDD_YY to VSS_YY.

In this manner, the link model is constituted by the power supply wiring sections 212a and 211b and one logic circuit section 212 without requiring eight logic circuit sections 212. Thus, the larger the scale of the logic circuit section 212 or the larger the number of the logic circuit sections 212, the more the scale of the simulation model can be reduced.

Accuracy of a simulation result will next be described. Here, the conventional second evaluation method described above and a circuit simulation apparatus according to the present embodiment are compared using the same target circuit.

Figure 8:
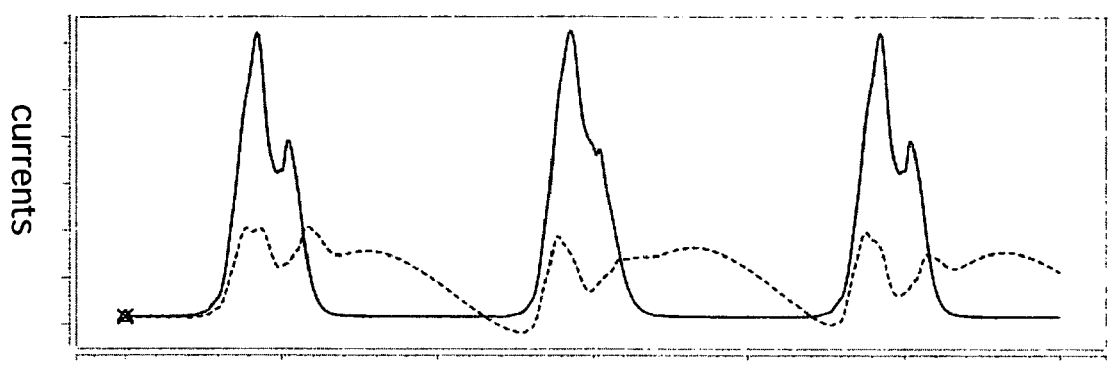
FIG. 8 is a view illustrating an example of a power supply current waveform obtained as a result of the simulation according to the present embodiment.

FIG. 8 is a view illustrating an example of a power supply current waveform obtained as a result of the simulation according to the present embodiment. A solid line denotes a power supply current waveform obtained by the conventional second evaluation method, and a broken line denotes a power supply current waveform obtained by the circuit simulation apparatus according to the present embodiment. The conventional second evaluation method performs simulation of the logic circuit section with a power supply voltage being fixed, so that a voltage drop due to an increase in the power supply current which is caused by the operation of the logic circuit section is not reflected, with the result that a larger power supply current than in the actual circuit flows. On the other hand, a voltage drop is reflected in the circuit simulation apparatus according to the present embodiment, so that the power supply current can be reduced with the result that a waveform close to that in the actual circuit can be obtained.

Figure 9:
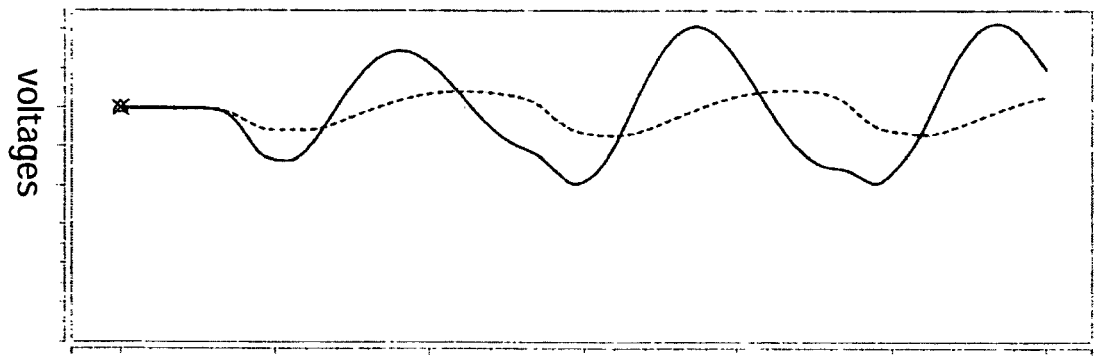
FIG. 9 is a view illustrating an example of a power supply voltage waveform obtained as a result of the simulation according to the present embodiment.
Figure 10:
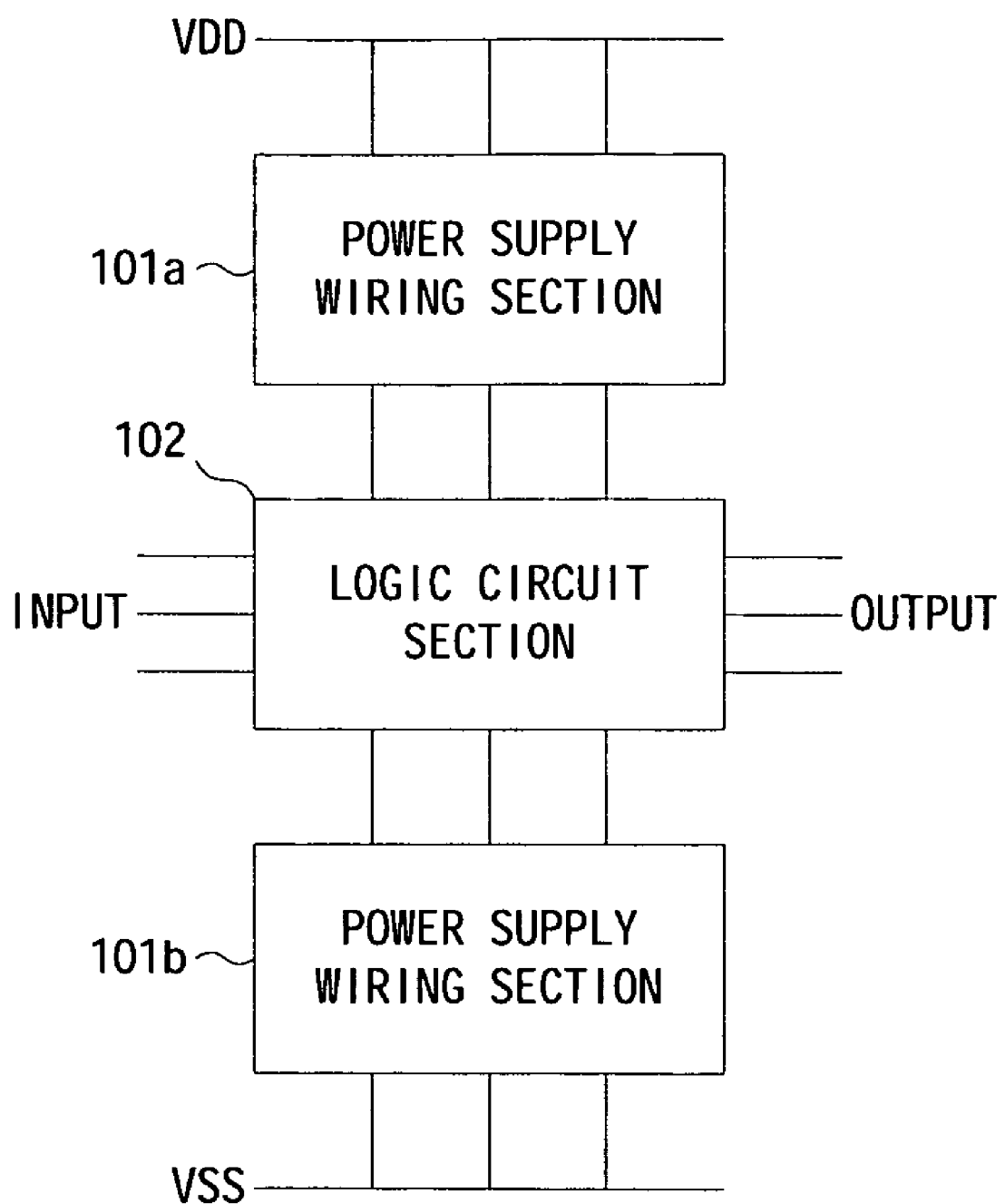
FIG. 10 is a circuit diagram illustrating an example of an integrated circuit.

FIG. 9 is a view illustrating an example of a power supply voltage waveform obtained as a result of the simulation according to the present embodiment. A solid line denotes a power supply voltage waveform obtained by the conventional second evaluation method, and a broken line denotes a power supply voltage waveform obtained by the circuit simulation apparatus according to the present embodiment. The conventional second evaluation method calculates a power supply current by performing simulation of the logic circuit section with a power supply voltage being fixed and performs simulation of the power supply wiring section using the calculated power supply current to thereby calculate a power supply voltage, so that a variation becomes larger than in the actual circuit. On the other hand, a variation can be reduced in the circuit simulation apparatus according to the present embodiment as in the case of the power supply current, with the result that a waveform close to that in the actual circuit can be obtained.

A conventional circuit simulation program can be used as the simulation execution section 23, so that the present embodiment can be applied to a circuit simulation model generation apparatus that outputs a link model. This circuit simulation model generation apparatus is obtained by removing the simulation execution section 23 from the circuit simulation apparatus according to the present embodiment. Further, conventional net list extraction programs can be used as the power supply system net extraction section 12 and the logic circuit net extraction section 13, respectively.

The power supply wiring model generation section includes the power supply system net extraction section of the embodiment. A logic circuit model generation section includes the logic circuit net extraction section of the embodiment. The link section includes the link model generation section of the embodiment. The generating of a power supply wiring model includes S11 in the embodiment. The generating of a logic circuit model includes S12 in the embodiment. The generating of a simulation model includes S13 in the embodiment.

Further, it is possible to provide a program that allows a computer constituting the circuit simulation model generation apparatus to execute the above steps as a circuit simulation model generation program. By storing the above program in a computer-readable storage medium, it is possible to allow a CPU of the computer constituting the circuit simulation model generation apparatus to execute the program. The computer-readable storage medium mentioned here includes: an internal storage device mounted in a computer, such as ROM or RAM, a portable storage medium such as a CD-ROM, a flexible disk, a DVD disk, a magneto-optical disk, or an IC card; a database that holds computer program; and another computer and database thereof.

According to the embodiment, it is possible to improve accuracy of circuit simulation while reducing time for the circuit simulation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A circuit simulation model generation apparatus that generates a simulation model used for a circuit simulation of a target circuit, the apparatus comprising:
   a computer including a processor; and
   a memory storing a program including instructions for:
   a power supply wiring model generation section that extracts information of a power supply wiring from information of the target circuit and generates, according to the extracted information of the power supply wiring, a power supply wiring model which is a model of the power supply wiring;
   a logic circuit model generation section that extracts information of a logic circuit from information of the target circuit and generates, according to the extracted information of the logic circuit, a logic circuit model which is a model of the logic circuit, the power supply wiring including a first terminal connected to the logic circuit, the logic circuit including a second terminal connected to the power supply wiring; and
   a link section that generates the simulation model by connecting the first terminal in the power supply wiring model to the second terminal in the logic circuit model via a voltage controller and connecting the first terminal in the power supply wiring model to the second terminal in the logic circuit model via a current controller, the voltage controller measuring a voltage of the first terminal in the power supply wiring model and supplying the measured voltage to the second terminal in the logic circuit model, the current controller measuring a current of the second terminal in the logic circuit model and supplying the measured current to the first terminal in the power supply wiring model.

2. The circuit simulation model generation apparatus according to claim 1, wherein
   the second terminal includes a high-potential side power supply wiring connecting terminal to which a high-potential side power supply potential is given from the power supply wiring and includes a low-potential side power supply wiring connecting terminal to which a low-potential side power supply potential is given from the power supply wiring, and
   the voltage controller controls a voltage between the high-potential side power supply wiring connecting terminal and the low-potential side power supply wiring connecting terminal to supply the measured voltage to the logic circuit model.

3. The circuit simulation model generation apparatus according to claim 1, wherein
   the first terminal includes a high-potential side logic circuit connecting terminal that gives a high-potential side power supply potential to the logic circuit and includes a low-potential side logic circuit connecting terminal that gives a low-potential side power supply potential to the logic circuit, and
   the current controller controls a current between the high-potential side logic circuit connecting terminal and the low-potential side logic circuit connecting terminal to supply the measured current to the power supply wiring model.

4. The circuit simulation model generation apparatus according to claim 1, wherein
   the logic circuit model generation section models the wiring of the logic circuit using a resistance value and a capacitance value, and
   the power supply wiring model generation section models the power supply wiring using a resistance value, an inductance value and a capacitance value.

5. The circuit simulation model generation apparatus according to claim 1, wherein,
   when the target circuit has N same logic circuits and the same inputs are given to the N logic circuits in the simulation, the link section adds, to the logic circuit model and the power supply wiring model, the current controller that acquires a current value of the second terminal in the logic circuit model and gives a current value of N times the acquired current value to the first terminal in the power supply wiring model.

6. The circuit simulation model generation apparatus according to claim 1, wherein
the link section inserts a resistor with a resistance of 0 into the second terminal in the logic circuit model in order to measure the current of the second terminal in the logic circuit model.

7. A non-transitory computer-readable storage medium storing a circuit simulation model generation program which when executed on a computer executes a process of generating a simulation model used for a circuit simulation of a target circuit, the process comprising:
extracting information of a power supply wiring from information of the target circuit;
generating, according to the extracted information of the power supply wiring, a power supply wiring model which is a model of the power supply wiring;
extracting information of a logic circuit from information of the target circuit;
generating, according to the extracted information of the logic circuit, a logic circuit model which is a model of the logic circuit, the power supply wiring including a first terminal connected to the logic circuit, the logic circuit including a second terminal connected to the power supply wiring; and
generating the simulation model by connecting the first terminal in the power supply wiring model to the second terminal in the logic circuit model via a voltage controller and connecting the first terminal in the power supply wiring model to the second terminal in the logic circuit model via a current controller, the voltage controller measuring a voltage of the first terminal in the power supply wiring model and supplying the measured voltage to the second terminal in the logic circuit model, the current controller measuring a current of the second terminal in the logic circuit model and supplying the measured current to the first terminal in the power supply wiring model.

8. The computer-readable storage medium according to claim 7, wherein
the second terminal includes a high-potential side power supply wiring connecting terminal to which a high-potential side power supply potential is given from the power supply wiring and includes a low-potential side power supply wiring connecting terminal to which a low-potential side power supply potential is given from the power supply wiring, and
the voltage controller controls a voltage between the high-potential side power supply wiring connecting terminal and the low-potential side power supply wiring connecting terminal to supply the measured voltage to the logic circuit model.

9. The computer-readable storage medium according to claim 7, wherein
the first terminal includes a high-potential side logic circuit connecting terminal that gives a high-potential side power supply potential to the logic circuit and includes a low-potential side logic circuit connecting terminal that gives a low-potential side power supply potential to the logic circuit, and
the current controller controls a current between the high-potential side logic circuit connecting terminal and the low-potential side logic circuit connecting terminal to supply the measured current to the power supply wiring model.

10. The computer-readable storage medium according to claim 7, wherein
the generating of the logic circuit model models the wiring of the logic circuit using a resistance value and a capacitance value, and
the generating of the power supply wiring model models the power supply wiring using a resistance value, an inductance value and a capacitance value.

11. The computer-readable storage medium according to claim 7, wherein,
when the target circuit has N same logic circuits and the same inputs are given to the N logic circuits in the simulation, the adding adds, to the logic circuit model and the power supply wiring model, the current controller that acquires a current value of the second terminal in the logic circuit model and gives a current value of N times the acquired current value to the first terminal in the power supply wiring model.

12. The computer-readable storage medium according to claim 7, wherein
the adding inserts a resistor with a resistance of 0 into the second terminal in the logic circuit model in order to measure the current of the second terminal in the logic circuit model.

13. A computer implemented circuit simulation model generation method that generates a simulation model used for a circuit simulation of a target circuit, the method comprising:
extracting, using a computer, information of a power supply wiring from information of the target circuit;
generating, using the computer, according to the extracted information of the power supply wiring, a power supply wiring model which is a model of the power supply wiring;
extracting, using the computer, information of a logic circuit from information of the target circuit;
generating, using the computer, according to the extracted information of the logic circuit, a logic circuit model which is a model of the logic circuit, the power supply wiring including a first terminal connected to the logic circuit, the logic circuit including a second terminal connected to the power supply wiring; and
generating, using the computer, the simulation model by connecting the first terminal in the power supply wiring model to the second terminal in the logic circuit model via a voltage controller and connecting the first terminal in the power supply wiring model to the second terminal in the logic circuit model via a current controller, the voltage controller measuring a voltage of the first terminal in the power supply wiring model and supplying the measured voltage to the second terminal in the logic circuit model, the current controller measuring a current of the second terminal in the logic circuit model and supplying the measured current to the first terminal in the power supply wiring model.

14. The circuit simulation model generation method according to claim 13, wherein
the second terminal includes a high-potential side power supply wiring connecting terminal to which a high-potential side power supply potential is given from the power supply wiring and includes a low-potential side power supply wiring connecting terminal to which a low-potential side power supply potential is given from the power supply wiring, and the voltage controller controls a voltage between the high-potential side power supply wiring connecting terminal and the low-potential side power supply wiring connecting terminal to supply the measured voltage to the logic circuit model.

15. The circuit simulation model generation method according to claim 13, wherein
the first terminal includes a high-potential side logic circuit connecting terminal that gives a high-potential side power supply potential to the logic circuit and includes a low-potential side logic circuit connecting terminal that gives a low-potential side power supply potential to the logic circuit, and
the current controller controls a current between the high-potential side logic circuit connecting terminal and the low-potential side logic circuit connecting terminal to supply the measured current to the power supply wiring model.

16. The circuit simulation model generation method according to claim 13, wherein
the generating of the logic circuit model models the wiring of the logic circuit using a resistance value and a capacitance value, and
the generating of the power supply wiring model models the power supply wiring using a resistance value, an inductance value and a capacitance value.

17. The circuit simulation model generation method according to claim 13, wherein,
when the target circuit has N same logic circuits and the same inputs are given to the N logic circuits in the simulation, the adding adds, to the logic circuit model and the power supply wiring model, the current controller that acquires a current value of the second terminal in the logic circuit model and gives a current value of N times the acquired current value to the first terminal in the power supply wiring model.

18. The circuit simulation model generation method according to claim 13, wherein
the adding inserts a resistor with a resistance of 0 into the second terminal in the logic circuit model in order to acquire the current of the second terminal in the logic circuit model.

19. A circuit simulation apparatus that performs a circuit simulation of a target circuit, comprising:
a computer including a processor; and
a memory storing a program including instructions for:
a power supply wiring model generation section that extracts information of a power supply wiring from information of the target circuit and generates, according to the extracted information of the power supply wiring, a power supply wiring model which is a model of the power supply wiring;
a logic circuit model generation section that extracts information of a logic circuit from information of the target circuit and generates, according to the extracted information of the logic circuit, a logic circuit model which is a model of the logic circuit, the power supply wiring including a first terminal connected to the logic circuit, the logic circuit including a second terminal connected to the power supply wiring;
a link section that generates the simulation model by connecting the first terminal in the power supply wiring model to the second terminal in the logic circuit model via a voltage controller and connecting the first terminal in the power supply wiring model to the second terminal in the logic circuit model via a current controller, the voltage controller measuring a voltage of the first terminal in the power supply wiring model and supplying the measured voltage to the second terminal in the logic circuit model, the current controller measuring a current of the second terminal in the logic circuit model and supplying the measured current to the first terminal in the power supply wiring model; and
a simulation execution section that performs the circuit simulation based on the simulation model to calculate a power supply waveform.

* * * * *